United States Patent
Arnborg et al.

(10) Patent No.: US 6,633,194 B2
(45) Date of Patent: Oct. 14, 2003

(54) MIXER

(75) Inventors: Torkel Arnborg, Stockholm (SE); Christian Nyström, Sollentuna (SE)

(73) Assignee: Telefonaktiebolaget LM Ericsson (Publ) (SE)

( * ) Notice: Subject to any disclaimer, the term of this patent is extended or adjusted under 35 U.S.C. 154(b) by 0 days.

(21) Appl. No.: 09/935,574

(22) Filed: Aug. 24, 2001

(65) Prior Publication Data

US 2002/0053930 A1 May 9, 2002

(30) Foreign Application Priority Data

Aug. 25, 2000 (SE) .......................................... 0003020-5

(51) Int. Cl.[7] .............................................. H04B 1/26
(52) U.S. Cl. .......................... 327/359; 327/356; 455/326; 455/330
(58) Field of Search ................................. 327/355, 356, 327/359; 455/330, 326

(56) References Cited

U.S. PATENT DOCUMENTS

| 4,479,259 A | 10/1984 | Fenk | 455/333 |
|---|---|---|---|
| 4,751,744 A | 6/1988 | Pavio, Jr. | 455/333 |
| 5,006,811 A | 4/1991 | Kruger | 455/325 |
| 5,339,462 A * | 8/1994 | Staudinger et al. | 455/330 |
| 5,563,545 A * | 10/1996 | Scheinberg | 327/389 |
| 5,589,791 A | 12/1996 | Gilbert | 455/326 |

\* cited by examiner

Primary Examiner—Dinh T. Le
(74) Attorney, Agent, or Firm—Burns, Doane, Swecker & Mathis, L.L.P.

(57) ABSTRACT

A mixer includes a first terminal and a second terminal forming a first input port for receiving a first signal having a first frequency; a second input port for receiving a second signal having a second frequency; a mixer output port for a resulting signal; a first group of valves having their control inputs coupled to the first terminal for receiving the first signal; a second group of valves having their control inputs coupled to the second terminal for receiving the first signal; and a third group of two valves having their control inputs coupled for receiving the second signal. The valves co-operate such that in operation the mixer produces the resulting signal responsive to the first and second signals. The mixer also includes at least one passive low pass filter having an inductor, the low pass filter being connected to the control input of a valve in the first and second groups.

6 Claims, 6 Drawing Sheets

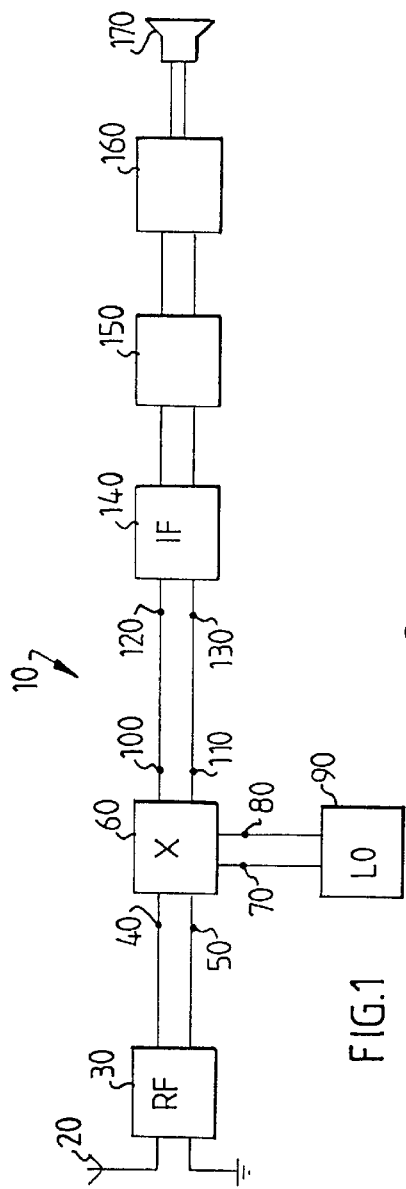
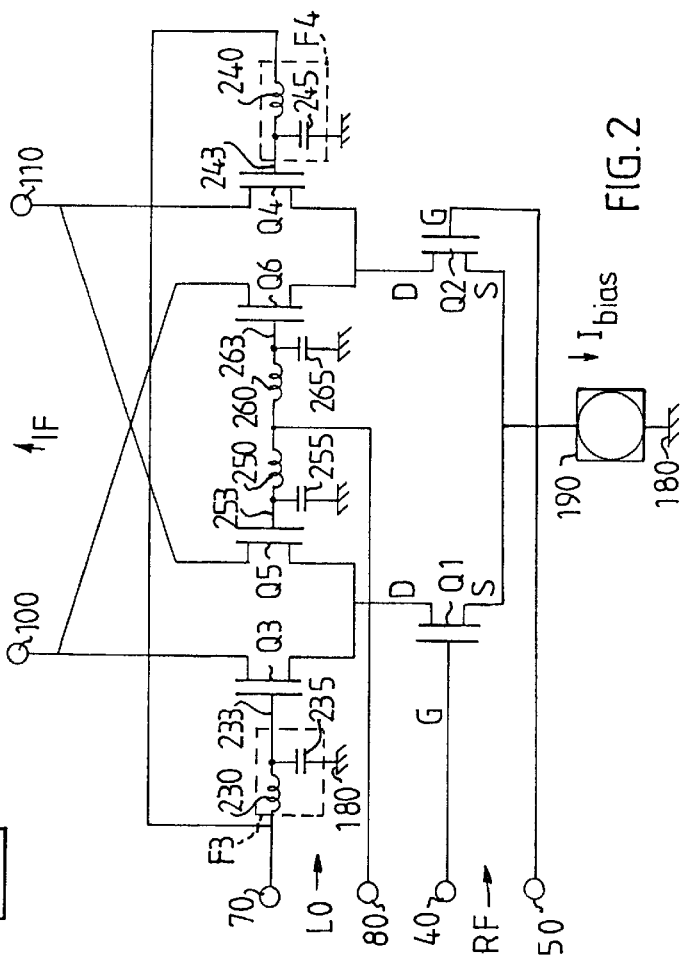
FIG.1
FIG.2

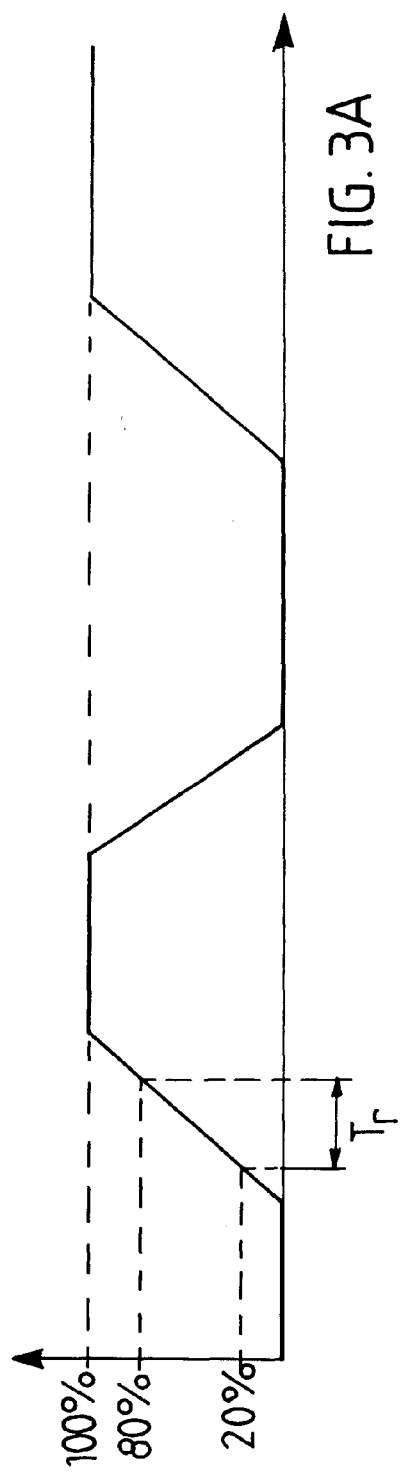
FIG. 3A
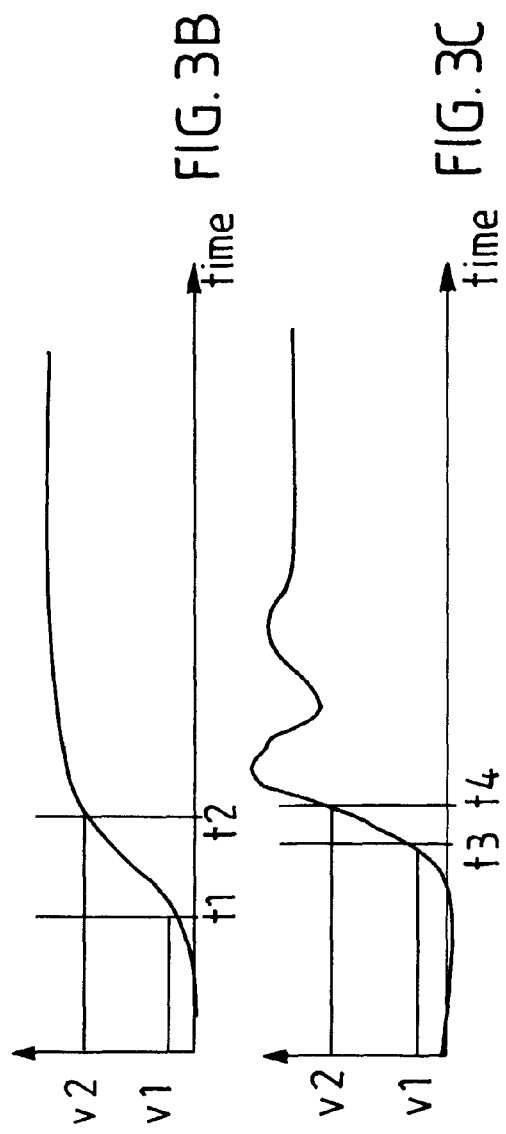
FIG. 3B
FIG. 3C

MIXER

TECHNICAL FIELD

The present invention relates to a mixer.

BACKGROUND

Mixers have been used in radio circuits for a long time. A mixer may be used to produce an intermediate frequency (IF) signal dependent on a received radio frequency (RF) signal and a local oscillator (LO) signal. The IF signal is delivered to a detector circuit, which generates an audio frequency (AF) signal in response to the IF signal. Hence, the mixer in co-operation with a suitable detector circuit can operate to extract a message from a radio signal.

U.S. Pat. No. 5,589,791 to Gilbert describes a classic active mixer commonly known as the "Gilbert mixer". The Gilbert mixer comprises a mixer core having four transistors whose bases are connected to an LO port for receiving a LO signal and whose collectors are connected to an IF output port. The mixer also has an RF input section having two transistors whose bases are connected to an RF port for receiving an RF signal and whose collectors are connected to the emitters of the transistors in the mixer core.

The operation of the mixer is as follows: In the absence of any voltage difference between the bases of the two transistors in the RF input section, the collector currents of these two transistors are essentially equal. Thus, a voltage applied to the LO port results in no change of output current. Conversely, if an RF signal is applied to the RF port, but no voltage difference is applied to the LO port, the output currents will again be balanced. Thus, it is only when a signal is applied to both the LO port and the RF port that an intermediate frequency signal appears at the IF port. A known problem with the classic active mixer is the switching noise generated by the mixer core transistors as they switch between their "on" and "off" states. U.S. Pat. No. 5,589,791 to Gilbert describes this problem, and illustrates noise bursts that are created during transition periods when the LO signal changes between high and low states. U.S. Pat. No. 5,589,791 to Gilbert also discloses a mixer having an RF input port, an LO input port and an active input driver connected to the LO input port. The input driver is a complex circuit including an input for receiving a single-sided LO signal, and no less than 21 transistors forming class AB emitter followers and an associated bias stage. The active input driver aims to cause a forced supply and withdrawal of charge from each of the LO input terminals of the mixer core for providing quicker transitions between the on and off states in the mixer core.

SUMMARY

An aspect of the invention relates to the problem of providing a mixer with improved performance at low cost.

This problem is addressed by a mixer, comprising:

a first terminal and a second terminal forming a first input port for receiving a first signal having a first frequency;

an second input port for receiving a second signal having a second frequency;

a mixer output port for a resulting signal; and a first group of valves having their control inputs coupled to the first terminal for receiving the first signal;

a second group of valves having their control inputs coupled to the second terminal for receiving the first signal; and a third group of two valves having their control inputs coupled for receiving the second signal;

said valves co-operating such that in operation the mixer produces the resulting signal responsive to the first and second signals. Moreover, the mixer comprises at least one passive low pass filter having an inductor; said at least one low pass filter being connected to the control input of a valve.

This filter advantageously operates to decrease the rise time of the signal controlling the valve. A quicker rise time of that signal causes a quicker transition of the valve from non-conducting to conducting state. Since the noise produced by a mixer emanates to a large extent from noise produced by a valve during transition from a conducting state to a non-conducting state, the total amount of noise is thereby reduced, when the mixer is provided with such filters. Since the filter has only passive components, the reliability of the mixer is improved and the noise contribution is minimal. An additional advantage attained with passive components is a low component cost. Hence, the mixer, when used in a receiver renders a reliable high fidelity radio receiver at a low cost.

BRIEF DESCRIPTION OF THE DRAWINGS

For simple understanding of the present invention, it will be described by means of examples and with reference to the accompanying drawings, of which FIG. 1 is a block diagram of an embodiment of a superheterodyne receiver.

FIG. 2 is a circuit diagram of an embodiment of the mixer shown in FIG. 1.

FIG. 3A is a voltage/time diagram illustrating the temporal progression of the amplitude of a LO signal.

FIG. 3B is a more detailed voltage/time diagram illustrating the temporal progression of the amplitude of a positive edge of the LO signal shown in FIG. 3A.

FIG. 3C is a voltage/time diagram illustrating the temporal progression of the amplitude of the signal at a valve gate in response to the positive edge signal illustrated in FIG. 3B.

DETAILED DESCRIPTION

Figure 4A:
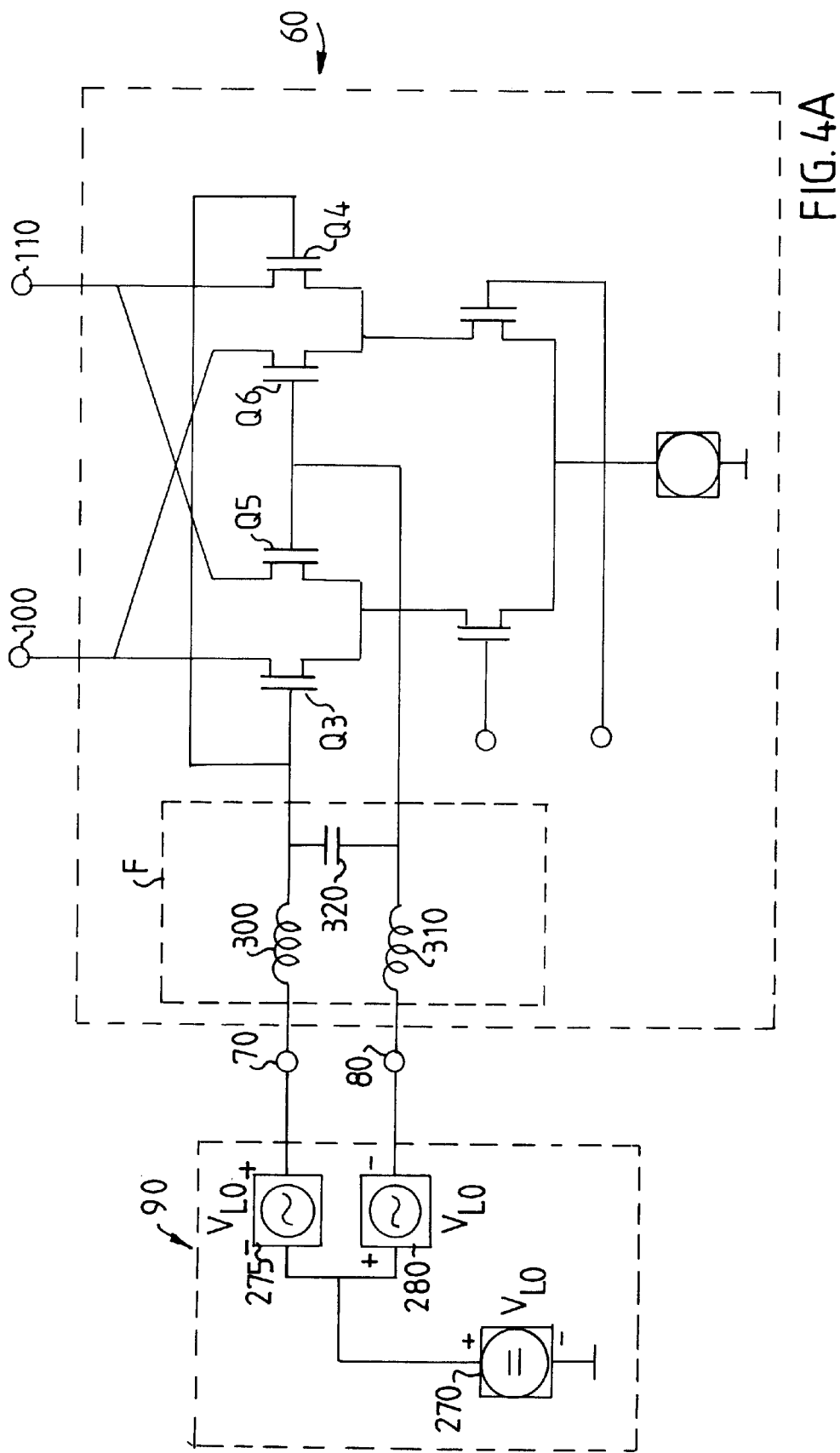
FIG. 4A is a circuit diagram of another embodiment of the mixer shown in FIG. 1, connected to a Local Oscillator.

In the following description similar features in different embodiments will be indicated by the same reference numerals.

FIG. 1 is a block diagram of an embodiment of a superheterodyne receiver 10 having an antenna 20 coupled to a radio frequency circuit 30. When a signal is received by the antenna, the radio frequency circuit 30 delivers a radio frequency signal (RF) to the inputs 40, 50 of a mixer 60.

The mixer 60 also has inputs 70, 80 for receiving a turning oscillator signal from a local oscillator 90, and outputs 110, 10 for delivery of an intermediate frequency signal (IF). The outputs 110, 10 are coupled to inputs 120, 130 of an intermediate frequency (IF) amplifier 140 having outputs for delivering an amplified IF signal to a detector circuit 150. The detector circuit 150 generates an audio-frequency (AF) signal in response to the IF signal, and the AF signal is delivered to an audio-frequency amplifier 160 operating to amplify the AF signal, and to deliver it to a load 170, such as a loudspeaker.

FIG. 2 is a circuit diagram of an embodiment of the mixer 60 shown in FIG. 1.

The mixer of FIG. 2 has a first transistor Q1 and a second transistor Q2, the gates of which are coupled to the inputs 40 and 50, respectively, for receiving the RF signal. The sources of transistors Q1 and Q2 are coupled to signal ground 180, preferably via a biasing current device 190.

The first LO input 70 is coupled to the gate 233 of a first switch transistor Q3 via an inductor 230, and to the gate 243 of a second switch transistor Q4 via an inductor 240. A A capacitor 235 is connected between signal ground and the junction of inductor 230 and the gate 233 of transistor Q3, such that the LC circuit forms a first low pass filter F3. Another capacitor 245 is likewise connected between signal ground and the junction of inductor 240 the gate 243 of transistor Q4, as illustrated in FIG. 2, 50 as to form a second low pass filter F4. The inductors 230 and 240 have an inductance and a series resistance. Because of the resistance the filter F3 and F4 are dampened, thereby avoiding undesired oscillation in the circuitry.

The second LO input 80 is coupled to the gate 253 of a third switch transistor Q5 via an inductor 250, and to the gate 263 of a fourth switch transistor Q6 via an inductor 260. Capacitors 255 and 265, respectively, are connected between the gates of transistors Q5 and Q6 respectively, and signal ground, as illustrated in FIG. 2. Inductor 250 in combination with capacitor 255 forms a third low pass filter F5, and inductor 260 in combination with capacitor 265 forms a fourth low pass filter F6. The inductors 250 and 260 also have an inductance and a resistance so as to avoid undesired oscillation in the circuitry.

The drain terminals of transistors Q3 and Q4 are connected to the first IF signal output 100, whereas the drain terminals of transistors Q5 and Q6 are connected to the second IF signal output 110.

FIG. 3A is a voltage/time diagram illustrating the temporal progression of the amplitude of the LO signal, i.e. the signal provided by the local oscillator 90 in FIG. 1. The rise time $T_r$ of a positive edge of a signal is usually defined as the duration for the signal amplitude to progress from 20% of a top value to 80% of the top value (see FIG. 3A).

FIG. 3B is a more detailed voltage/time diagram illustrating the temporal progression of the amplitude of a positive edge of the LO signal shown in FIG. 3A.

FIG. 3C is a voltage/time diagram illustrating the temporal progression of the amplitude of the signal at gate 233 (See FIG. 2) in response to the positive edge signal illustrated in FIG. 3B. With reference to FIG. 2, the transistor Q3 is turned off when the amplitude at the gate is below the level v1 shown in FIGS. 3B and 3C. When the amplitude at the gate is above the level v2 shown in FIGS. 3B/3C, the transistor Q3 is conducting so well that there is no voltage swing at its output, i.e. the transistor is saturated.

By comparing the signal portions shown in FIGS. 3B and 3C it can be clearly seen that the time period t4-t3 in FIG. 3C is shorter than the time period t2-t1 in FIG. 3B. As a matter of fact the rise time of the LO signal is shorter after having passed the LO signal through the filter F3 (See FIG. 2).

It can be seen, by comparing FIGS. 3B and 3C that when a positive edge of the LO signal, having a certain slope, is delivered to terminal 70 the amplitude at gate terminal 233 (See FIG. 2) is initially unaffected. During this phase, however, the filter F3 is charged with reactive energy. Hence, the filter F3 will initially cause a delay, and thereafter the filter will cause the signal level at gate terminal 233 to have a steeper slope than that of terminal 70. A quicker rise time of the signal causes a quicker transition of transistor Q3 from non-conducting state to conducting state. Since the noise contribution from a transistor is predominantly generated during transition between a conducting state and a non-conducting state, the amount of noise is thereby advantageously reduced, when the mixer is provided with filters such as F3, F4, F5 and F6.

According to preferred embodiments the low pass filters F3, F4, F5 and F6 has only passive components, thereby providing a high reliability and a minimal noise contribution. An additional advantage attained with passive components is a low component cost. Hence, the mixer 60, when used in a receiver renders a reliable high fidelity radio signal receiver at a low cost.

According to an embodiment the inductance of the inductor 230 and the capacitance of the capacitor 235 in filter F3 are selected such that the time constant of the filter F3 has a value similar to the rise time of the LO signal. In this connection the rise time is defined as mentioned in connection with FIG. 3A above. According to embodiments of the invention the time constant of filter F3 has a value in the range from 0,2 to 10 times the rise time of the LO signal. According to some embodiments of the invention the time constant of filter F3 has a value in the range from 0,5 to 2 times the rise time of the LO signal. According to a preferred embodiment the time constant of the filter is selected in the range from 90% to 110% of the rise time of the LO signal.

Since, normally, the fall time of the LO signal is substantially the same as the rise time thereof, the relation between the fall time and the time constant of the filter will normally be the same. If, however, there is a distinct difference between the rise and fall time of the LO signal, then the above relations should apply to the time constant of the filter as compared to the mean value of the rise and fall time of the LO signal.

According to one embodiment of the invention the time constant of the filters is selected to 20 picoseconds for a circuit wherein the LID signal has a rise time of 20 picoseconds. The LO signal may, for example, have a period of 120 ps.

An example of a mixer with the circuit diagram of FIG. 2 includes the following component values: Each of the inductors 230, 240, 250, 260 has an inductance of 1 nH, and a series resistance of 50 Ohm. Each of the capacitors 235, 245, 255, 265 has a capacitance of 0,03 pF. The time constant of the filter is thus 34 ps, obtained as 2* pi *.sqrt(LC).

The LO signal has an input period time of 120 ps, a rise time of 20 ps, and a fall time of 20 ps. The puse width of the LO signal in this example is 40 ps.

The above discussion about the relation between the filter time constant and the LO signal is applicable, not only to the FIG. 2 embodiment, but also to the other embodiments of the invention described in this text.

FIG. 4A includes a circuit diagram of another embodiment of the mixer 60 shown in FIG. 1. FIG. 4A also illustrates a block diagram of a Local Oscillator 90, having a DC bias source 270 and AC signal sources 275, 280. The signal source 280 is 180 degrees phase shifted in relation to signal source 275, as indicated by the polarity references + and − in FIG. 4A. According to the FIG. 4A embodiment a filter F is connected to terminals 70, 80. The filter F includes a first inductor 300 which is coupled between input terminal 70 and the gates of transistors Q3 and Q4. A second inductor 310 is coupled between input terminal 80 and the gates of transistors Q5 and Q6, and a capacitor 320 is coupled between the gates of transistors Q3/Q4 and Q5/Q6, as shown in FIG. 4. The inductors 300, 310 are inductive and resistive for the same reason as mentioned for inductor 230 above.

Figure 4B:
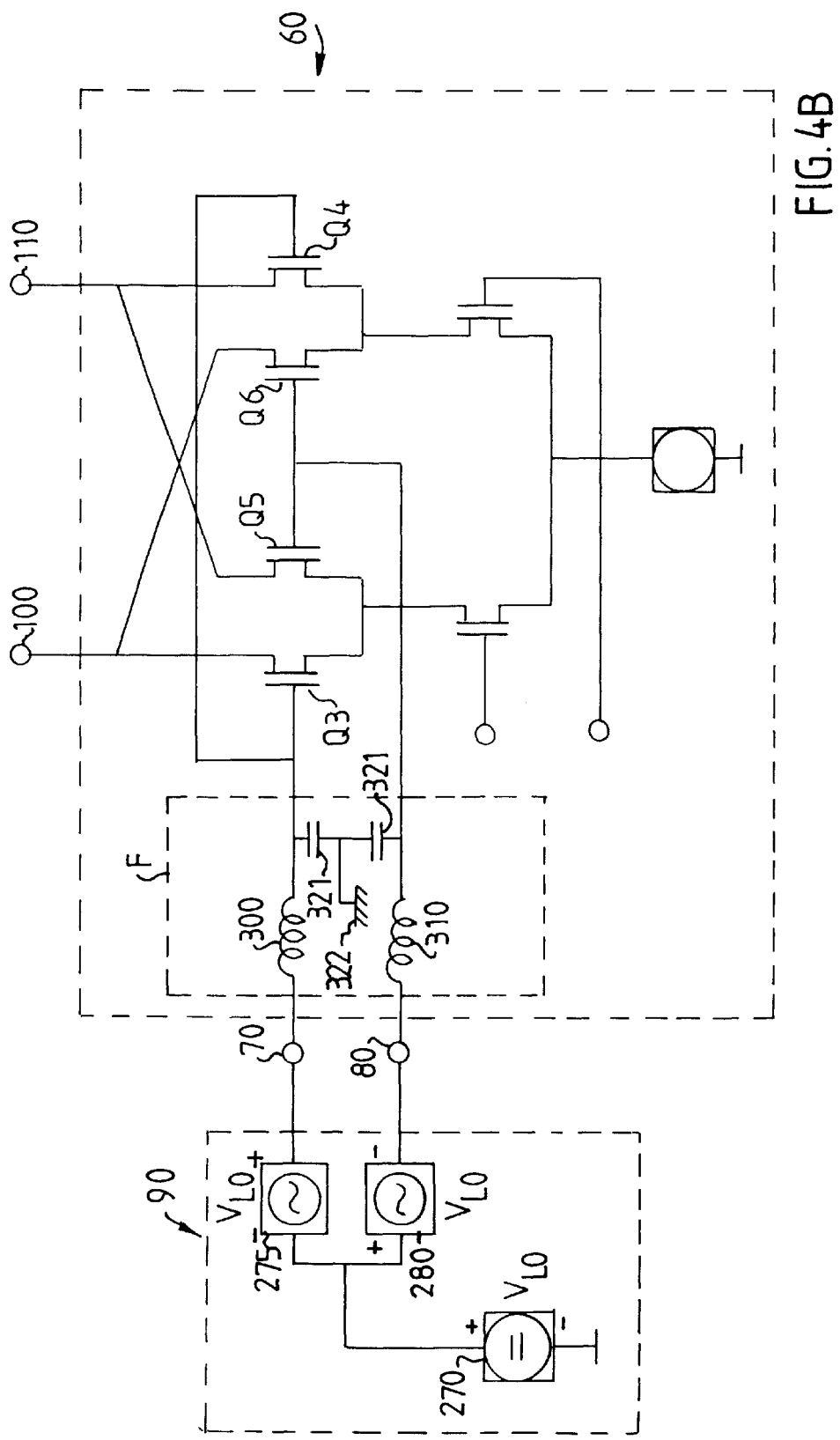
FIG. 4B illustrates another version of the circuitry of FIG. 4A.

FIG. 4B differs from FIG. 4A in that two capacitors 321 replaces the single capacitor 320. Each capacitor 321 has twice the capacitance value of capacitor 320, and the terminal between the capacitors is connected to ground 322. In this manner the capacitors 321 co-operate to provide a capacitance of the same value as capacitor 320, but with the additional advantage of being grounded so as to obtain a defined DC-level.

Figure 5:
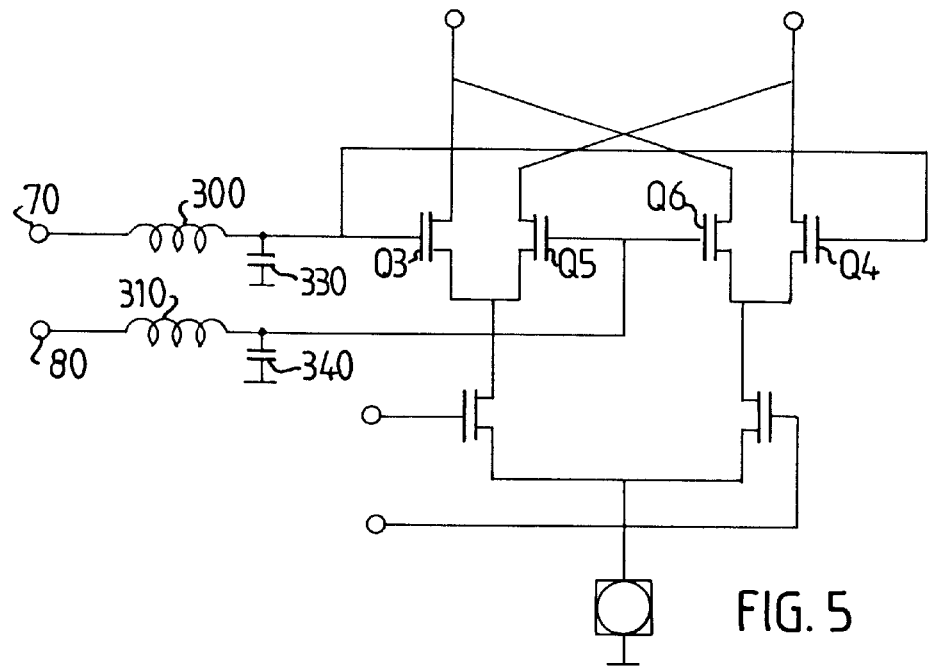
FIG. 5 is a circuit diagram of yet another embodiment of the mixer shown in FIG. 1.

FIG. 5 is a circuit diagram of yet another embodiment of the mixer 60 shown in FIG. 1. According to the FIG. 5 embodiment a first inductor 300 is coupled between input terminal 70 and the gates of transistors Q3 and Q4 and a capacitor 330 is coupled between the gates of transistors Q3/Q4 and ground, as shown in FIG. 5. A second inductor 310 is coupled between input terminal 80 and the gates of transistors Q5 and Q6, and a capacitor 340 is coupled between the gates of transistors Q3/Q4 and ground.

Figure 6:
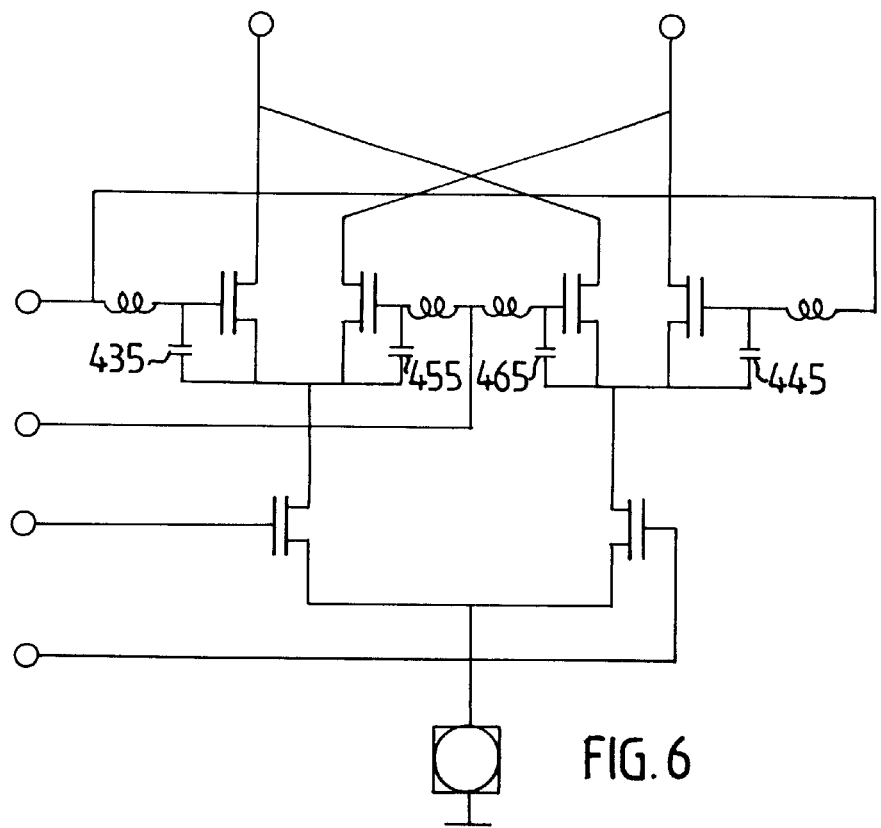
FIG. 6 is a circuit diagram of yet another embodiment of the mixer shown in FIG. 1.

FIG. 6 is a circuit diagram of yet another embodiment of the mixer 60 shown in FIG. 1. The FIG. 6 embodiment corresponds to the FIG. 2 embodiment, but whereas the capacitors 235, 245, 255, 265 in FIG. 2 are connected to ground, each of the corresponding capacitors 435, 445, 455, 465 in the FIG. 6 embodiment are connected to the drain terminal of the respective transistor.

Figure 7:
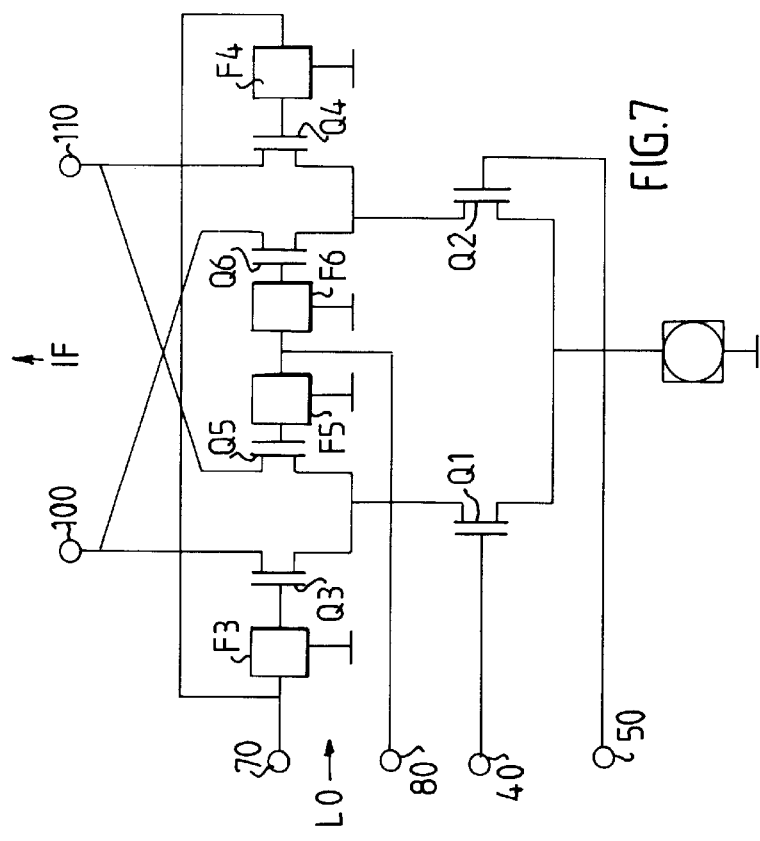
FIG. 7 is a combined block diagram/circuit diagram of an embodiment of the mixer shown in FIG. 1, wherein the filters are represented as blocks.
Figure 8:
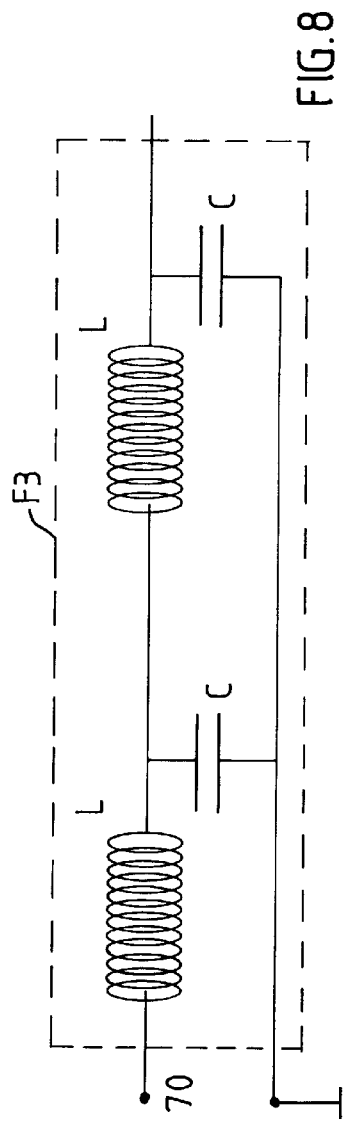
FIG. 8 illustrates an embodiment of a filter having two inductors and two capacitors.

FIG. 7 is a combined block diagram/circuit diagram of an embodiment of the mixer 60 shown in FIG. 1, wherein the filters are represented as blocks. The filters F3, F4, F5 and F6 can consist of a simple passive filter stage having a single inductor and a single capacitor as described with reference to FIG. 2 above. In an alternative embodiment each filter has plural LC pairs, FIG. 8 illustrates an embodiment of the filter F3 having two inductors and two capacitors. Also when the filter has plural LC pairs, as shown in FIG. 8, the above described relation between the filter time constant and the rise time of the LO signal applies.

What is claimed is:

1. A mixer, comprising:
    a first and a second transistor having their gates coupled to a first input terminal of a mixer input port for receiving a local oscillator signal;
    a third and a fourth transistor having their gates coupled to a second input terminal of the mixer input port for receiving the local oscillator signal;
    a fifth and a sixth transistor having their gates coupled to a first and a second input terminal, respectively, of a mixer input port for receiving a radio frequency signal;
    the sources of the second and fourth transistor being coupled to the drain of the sixth transistor;
    the sources of the fifth and sixth transistor being coupled to ground;
    the drains of the first and fourth transistor being coupled to one output terminal of a mixer output port for an intermediate frequency signal; and
    the drains of the second and third transistor being coupled to the other output terminal of the mixer output port;
    wherein
    the gates of the first and second transistors and the gates of the third and fourth transistors are coupled to the first and second input terminals of the mixer input port for the local oscillator signal, respectively, via respective separate passive low pass filters.

2. The mixer according to claim 1, wherein each filter comprises an inductor coupled between the gate of the respective transistor and the respective input terminal.

3. The mixer according claim 2, wherein the junction between the gate of the respective transistor and the respective inductor is coupled to ground via a capacitor.

4. The mixer according to claim 2, wherein at least one capacitor is connected between the gates of the first and second transistors and the gates of the third and fourth transistors.

5. The mixer according to claim 4, wherein two capacitors are connected between the gates of the first and second transistors and the gates of the third and fourth transistors, the junction between the capacitors being connected to ground.

6. The mixer according to claim 2, wherein the junction between the gate of the respective transistor and the respective inductor is coupled to the source of the respective transistor via a capacitor.

* * * * *